(12) United States Patent
Terasaki

(10) Patent No.: US 12,035,468 B2
(45) Date of Patent: Jul. 9, 2024

(54) BONDED BODY, INSULATED CIRCUIT BOARD WITH HEAT SINK, AND HEAT SINK

(71) Applicant: MITSUBISHI MATERIALS CORPORATION, Tokyo (JP)

(72) Inventor: Nobuyuki Terasaki, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 553 days.

(21) Appl. No.: 17/282,788

(22) PCT Filed: Nov. 8, 2019

(86) PCT No.: PCT/JP2019/043855
§ 371 (c)(1),
(2) Date: Apr. 5, 2021

(87) PCT Pub. No.: WO2020/096040
PCT Pub. Date: May 14, 2020

(65) Prior Publication Data
US 2021/0410284 A1    Dec. 30, 2021

(30) Foreign Application Priority Data
Nov. 8, 2018    (JP) ................................ 2018-210823

(51) Int. Cl.
*B23K 35/28* (2006.01)
*H05K 1/03* (2006.01)
(Continued)

(52) U.S. Cl.
CPC ............ *H05K 1/05* (2013.01); *B23K 35/286* (2013.01); *H05K 1/0306* (2013.01);
(Continued)

(58) Field of Classification Search
None
See application file for complete search history.

(56) References Cited

U.S. PATENT DOCUMENTS 8,883,318 B2 * 11/2014 Yamamoto ......... B23K 35/0233
428/660
9,480,144 B2 * 10/2016 Nagatomo ............. B23K 1/012
(Continued)

FOREIGN PATENT DOCUMENTS

| CN | 1237195 C | 1/2006 |
| CN | 101939857 A | 1/2011 |

(Continued)

OTHER PUBLICATIONS

Notice of Allowance mailed Mar. 1, 2023, issued for TW108140622 and English translation of the Search Report.
(Continued)

*Primary Examiner* — Kim S. Horger
(74) *Attorney, Agent, or Firm* — Locke Lord LLP; James E. Armstrong, IV; Nicholas J. DiCeglie, Jr.

(57) ABSTRACT

A bonded body includes an aluminum member made of an aluminum alloy and a copper member made of copper or a copper alloy, in which the aluminum member is made of an Al—Mn-based alloy containing Mn, an Mn concentration $C_0$ of the entire aluminum member is in a range of 0.4 mass % or more and 1.5 mass % or less, and, when an Mn concentration in a region excluding a precipitate in the aluminum member is defined as an Mn solid solution concentration $C_1$ and a value obtained by subtracting the Mn solid solution concentration $C_1$ from the Mn concentration $C_0$ of the entire aluminum member is defined as an Mn precipitate concentration $C_2$, a ratio $C_1/C_2$ of the Mn solid solution concentration $C_1$ to the Mn precipitate concentration $C_2$ is in a range of 0.1 or more and 2.7 or less.

3 Claims, 6 Drawing Sheets

(51) Int. Cl.
    *H05K 1/05*           (2006.01)
    *H05K 3/00*           (2006.01)
    *C22C 9/00*           (2006.01)
    *C22C 21/00*         (2006.01)

(52) U.S. Cl.
    CPC ............. *H05K 3/0061* (2013.01); *C22C 9/00* (2013.01); *C22C 21/00* (2013.01)

(56) References Cited

U.S. PATENT DOCUMENTS

| | | | |
|---|---|---|---|
| 9,650,706 B2 | 5/2017 | Sekiya et al. | |
| 9,723,707 B2 * | 8/2017 | Terasaki | H01L 23/3735 |
| 10,319,664 B2 * | 6/2019 | Terasaki | H01L 23/142 |
| 2014/0308541 A1 * | 10/2014 | Kitawaki | B23K 35/286 |
| | | | 228/221 |
| 2017/0246840 A1 | 8/2017 | Kuroda et al. | |
| 2018/0108593 A1 | 4/2018 | Terasaki et al. | |
| 2019/0194780 A1 * | 6/2019 | Li | C22C 21/00 |

FOREIGN PATENT DOCUMENTS

| | | |
|---|---|---|
| EP | 3285291 A1 | 2/2018 |
| JP | 3171234 B2 | 5/2001 |
| JP | 2004-288828 A | 10/2004 |
| JP | 2007-009291 A | 1/2007 |
| JP | 2009-224571 A | 10/2009 |
| JP | 2012-169318 A | 9/2012 |
| JP | 2014-074226 A | 4/2014 |
| JP | 2014-099596 A | 5/2014 |
| JP | 2014-107516 A | 6/2014 |
| JP | 2016-063145 A | 4/2016 |
| JP | 2016-176098 A | 10/2016 |
| JP | 2016-208009 A | 12/2016 |
| JP | 2016-208010 A | 12/2016 |
| JP | 2017-174927 A | 9/2017 |
| TW | 201833342 A | 9/2018 |
| WO | 2011/155379 A1 | 12/2011 |

OTHER PUBLICATIONS

Supplementary European Search Report mailed Jul. 22, 2022, issued for European Patent Application No. 19881065.7.

International Search Report mailed Dec. 24, 2019, issued for PCT/JP2019/043855 and English translation thereof.

Notice of Allowance mailed Oct. 23, 2023, issued for CN201980066728.5 and English translation of the Search Report.

* cited by examiner

BONDED BODY, INSULATED CIRCUIT BOARD WITH HEAT SINK, AND HEAT SINK

TECHNICAL FIELD

This invention relates to a bonded body in which an aluminum alloy member made of an Al—Mn-based alloy containing Mn and a copper member made of copper or a copper alloy are bonded to each other, an insulating circuit substrate with a heat sink in which the heat sink is bonded to the insulating circuit substrate having a circuit layer formed on one surface of an insulating layer, and a heat sink in which a copper member layer is formed on a heat sink main body.

Priority is claimed on Japanese Patent Application No. 2018-210823, filed Nov. 8, 2018, the content of which is incorporated herein by reference.

BACKGROUND ART

Semiconductor devices such as LEDs or power modules have a structure in which a semiconductor element is bonded onto a circuit layer made of a conductive material.

In power semiconductor elements for high-power control that are used to control wind-power generation, electric vehicles, hybrid vehicles, and the like, since the amount of heat generated is large, as a substrate on which the power semiconductor element is mounted, for example, an insulating circuit substrate including a ceramic substrate made of aluminum nitride (AlN), alumina ($Al_2O_3$), or the like and a circuit layer formed by bonding a metal plate having an excellent conductive property to one surface of the ceramic substrate has been broadly used in the related art. As a power module substrate, a substrate having a metal layer formed on the other surface of the ceramic substrate also has been provided.

For example, a power module described in Patent Document 1 is provided with a structure including an insulating circuit substrate in which a circuit layer and a metal layer are formed by bonding an aluminum plate or a copper plate to one surface and the other surface of a ceramic substrate, respectively, and a semiconductor element bonded onto the circuit layer.

In addition, the power module is provided with a configuration in which a heat sink is bonded to the metal layer side of the insulating circuit substrate and heat transferred from the semiconductor element toward the insulating circuit substrate side is dissipated to the outside through the heat sink.

In the related art, as a method for bonding an insulating circuit substrate and a heat sink, for example, Patent Document 2 discloses a method in which grease is interposed between a metal layer of the insulating circuit substrate and the heat sink to bond the insulating circuit substrate and the heat sink by screw fastening.

In addition, Patent Document 3 discloses a method in which a metal layer of an insulating circuit substrate and a heat sink are bonded to each other using a solder material.

However, in a case where a metal layer and a heat sink are bonded to each other through grease or a solder material as described in Patent Document 2 and 3, since the grease or the solder material has a larger heat resistance than the metal layer or the heat sink, the transfer of heat in the bonding part between the metal layer and the heat sink becomes insufficient, and there is a concern that the heat radiation characteristic may degrade.

In addition, in the case of using grease, the grease deteriorates when a heat cycle or a power cycle is applied, and there is a concern that the heat resistance may further increase.

Furthermore, in a case where the bonding surface of the metal layer or the heat sink is made of aluminum or an aluminum alloy, since an Al oxide film is formed on the surface of the bonding surface, there is a concern that it may become impossible to firmly bond the metal layer and the heat sink with the solder material.

Therefore, Patent Document 4 proposes a method in which a metal layer and a heat sink are bonded to each other using a brazing material.

In addition, Patent Document 5 proposes a method in which a metal layer made of copper or a copper alloy and a heat sink made of aluminum or an aluminum alloy are bonded to each other by solid phase diffusion bonding.

CITATION LIST

Patent Literature

[Patent Document 1]
Japanese Patent No. 3171234
[Patent Document 2]
Japanese Unexamined Patent Application, First Publication No. 2004-288828
[Patent Document 3]
Japanese Unexamined Patent Application, First Publication No. 2009-224571
[Patent Document 4]
Japanese Unexamined Patent Application, First Publication No. 2012-169318
[Patent Document 5]
Japanese Unexamined Patent Application, First Publication No. 2014-099596

SUMMARY OF INVENTION

Technical Problem

By the way, as the aluminum alloy that configures the heat sink, there is a case where, for example, an Al—Mn-based alloy such as A3003 alloy is used. In this Al—Mn-based alloy, precipitates containing Mn are dispersed, whereby the strength improves, the thermal conductivity is relatively high, and the heat radiation characteristic is excellent.

Here, in the case of bonding a heat sink made of the Al—Mn-based alloy and a metal layer of an insulating circuit substrate using a brazing material as described in Patent Document 4, there is a concern that the bonding temperature may become relatively higher than the melting point of the brazing material, the Mn that has been precipitated may form a solid solution in the matrix, the thermal conductivity of the heat sink made of the Al—Mn-based alloy may decrease, and the heat radiation characteristic may degrade.

In addition, in the case of solid phase diffusion bonding the heat sink made of the Al—Mn-based alloy and the metal layer of the insulating circuit substrate as described in Patent Document 5, the bonding temperature becomes low compared with that in the case of bonding the heat sink and the metal layer by brazing, but there is a concern that Mn that has been precipitated during bonding may form a solid solution in the matrix, the thermal conductivity of the heat sink made of the Al—Mn-based alloy may decrease, and the heat radiation characteristic may degrade.

The present invention has been made in consideration of the above-described circumstances, and an object of the present invention is to provide a bonded body capable of suppressing a decrease in the thermal conductivity of an aluminum member even in a case where the aluminum member made of an Al—Mn-based alloy and a copper member made of copper or a copper alloy are bonded to each other, an insulating circuit substrate with a heat sink and a heat sink both including the bonded body.

Solution to Problem

In order to solve the above-described problem, a bonded body of the present invention is a bonded body including an aluminum member made of an aluminum alloy and a copper member made of copper or a copper alloy, the aluminum member and the copper member being bonded to each other by solid phase diffusion bonding, in which the aluminum member is made of an Al—Mn-based alloy containing Mn, an Mn concentration $C_0$ of an entirety of the aluminum member is in a range of 0.4 mass % or more and 1.5 mass % or less, and, when an Mn concentration in a region excluding a precipitate in the aluminum member is defined as an Mn solid solution concentration $C_1$ and a value obtained by subtracting the Mn solid solution concentration $C_1$ from the Mn concentration $C_0$ of the entire aluminum member is defined as an Mn precipitate concentration $C_2$, a ratio $C_1/C_2$ of the Mn solid solution concentration $C_1$ to the Mn precipitate concentration $C_2$ is in a range of 0.1 or more and 2.7 or less.

According to the bonded body having this configuration, in a case where the Mn concentration in the region excluding the precipitate in the aluminum member is defined as the Mn solid solution concentration $C_1$ and the value obtained by subtracting the Mn solid solution concentration $C_1$ from the Mn concentration $C_0$ of the entire aluminum member is defined as the Mn precipitate concentration $C_2$, since the ratio $C_1/C_2$ of the Mn solid solution concentration $C_1$ to the Mn precipitate concentration $C_2$ is set in a range of 0.1 or more and 2.7 or less, in the aluminum member made of the Al—Mn-based alloy, the precipitate containing Mn is sufficiently dispersed, the amount of the Mn solid solution is small, the strength of the aluminum member is secured, and the thermal conductivity is sufficiently secured.

Therefore, it is possible to efficiently transfer heat spread in the copper member toward the aluminum member and to provide a bonded body having an excellent heat radiation characteristic.

Here, in the bonded body of the present invention, a total concentration of Cu, Si, and Fe in the aluminum member is preferably 1.5 mass % or less.

In this case, since the total concentration of Cu, Si, and Fe in the aluminum member is limited to 1.5 mass % or less, it is possible to promote the formation of the precipitate containing Mn, the amount of the Mn solid solution decreases, and it is possible to more sufficiently secure the thermal conductivity of the aluminum member.

An insulating circuit substrate with a heat sink of the present invention is an insulating circuit substrate with a heat sink including an insulating layer, a circuit layer formed on one surface of the insulating layer, a metal layer formed on the other surface of the insulating layer, and a heat sink disposed on a surface of the metal layer opposite to the insulating layer, in which a bonding surface of the metal layer with the heat sink is made of copper or a copper alloy, a bonding surface of the heat sink with the metal layer is made of an Al—Mn-based alloy containing Mn, an Mn concentration $C_0$ of an entirety of the Al—Mn-based alloy is in a range of 0.4 mass % or more and 1.5 mass % or less, and, when an Mn concentration in a region excluding a precipitate in the Al—Mn-based alloy of the heat sink is defined as an Mn solid solution concentration $C_1$ and a value obtained by subtracting the Mn solid solution concentration $C_1$ from the Mn concentration $C_0$ of an entirety of the Al—Mn-based alloy is defined as an Mn precipitate concentration $C_2$, a ratio $C_1/C_2$ of the Mn solid solution concentration $C_1$ to the Mn precipitate concentration $C_2$ is in a range of 0.1 or more and 2.7 or less.

According to the insulating circuit substrate with a heat sink having this configuration, in a case where the Mn concentration in the region excluding the precipitate in the Al—Mn-based alloy of the heat sink is defined as the Mn solid solution concentration $C_1$ and the value obtained by subtracting the Mn solid solution concentration $C_1$ from the Mn concentration $C_0$ of the entire Al—Mn-based alloy is defined as the Mn precipitate concentration $C_2$, since the ratio $C_1/C_2$ of the Mn solid solution concentration $C_1$ to the Mn precipitate concentration $C_2$ is set to be in a range of 0.1 or more and 2.7 or less, in the Al—Mn-based alloy of the heat sink, the precipitate containing Mn is sufficiently dispersed, the amount of the Mn solid solution is small, the strength of the heat sink is secured, and the thermal conductivity is sufficiently secured.

Therefore, it is possible to efficiently transfer heat spread in the metal layer made of copper or a copper alloy toward the heat sink and to provide an insulating circuit substrate with a heat sink having an excellent heat radiation characteristic.

Here, in the insulating circuit substrate with a heat sink of the present invention, a total concentration of Cu, Si, and Fe in the Al—Mn-based alloy of the heat sink is preferably 1.5 mass % or less.

In this case, since the total concentration of Cu, Si, and Fe in the Al—Mn-based alloy of the heat sink is limited to 1.5 mass % or less, it is possible to promote the formation of the precipitate containing Mn, the amount of the Mn solid solution decreases, and it is possible to more sufficiently secure the thermal conductivity of the heat sink.

A heat sink of the present invention is a heat sink including a heat sink main body and a copper member layer that is bonded to the heat sink main body and is made of copper or a copper alloy, in which a bonding surface of the heat sink main body with the copper member layer is made of an Al—Mn-based alloy containing Mn, an Mn concentration $C_0$ of an entirety of the Al—Mn-based alloy is in a range of 0.4 mass % or more and 1.5 mass % or less, and, when an Mn concentration in a region excluding a precipitate in the Al—Mn-based alloy of the heat sink main body is defined as an Mn solid solution concentration $C_1$ and a value obtained by subtracting the Mn solid solution concentration $C_1$ from the Mn concentration $C_0$ of an entirety of the Al—Mn-based alloy is defined as an Mn precipitate concentration $C_2$, a ratio $C_1/C_2$ of the Mn solid solution concentration $C_1$ to the Mn precipitate concentration $C_2$ is in a range of 0.1 or more and 2.7 or less.

According to the heat sink having this configuration, in a case where the Mn concentration in the region excluding the precipitate in the Al—Mn-based alloy of the heat sink main body is defined as the Mn solid solution concentration $C_1$ and the value obtained by subtracting the Mn solid solution concentration $C_1$ from the Mn concentration $C_0$ of the entire Al—Mn-based alloy is defined as the Mn precipitate concentration $C_2$, since the ratio $C_1/C_2$ of the Mn solid solution concentration $C_1$ to the Mn precipitate concentration $C_2$ is set to be in a range of 0.1 or more and 2.7 or less, in the Al—Mn-based alloy of the heat sink main body, the precipitate containing Mn is sufficiently dispersed, the amount of the Mn solid solution is small, the strength of the heat sink main body is secured, and the thermal conductivity is sufficiently secured.

Therefore, it is possible to efficiently transfer heat spread in the copper member layer toward the heat sink main body and to provide a heat sink having an excellent heat radiation characteristic.

Here, in the heat sink of the present invention, a total concentration of Cu, Si, and Fe in the Al—Mn-based alloy of the heat sink main body is preferably 1.5 mass % or less.

In this case, since the total concentration of Cu, Si, and Fe in the Al—Mn-based alloy of the heat sink main body is limited to 1.5 mass % or less, it is possible to promote the formation of the precipitate containing Mn, the amount of the Mn solid solution decreases, and it is possible to more sufficiently secure the thermal conductivity of the heat sink main body.

Advantageous Effects of Invention

According to the present invention, it becomes possible to provide a bonded body capable of suppressing a decrease in the thermal conductivity of an aluminum member even in a case where the aluminum member made of an Al—Mn-based alloy and a copper member made of copper or a copper alloy are bonded to each other, an insulating circuit substrate with a heat sink and a heat sink both including the bonded body.

DESCRIPTION OF EMBODIMENTS

First Embodiment

Hereinafter, embodiments of the present invention will be described with reference to accompanying drawings.

Figure 1:
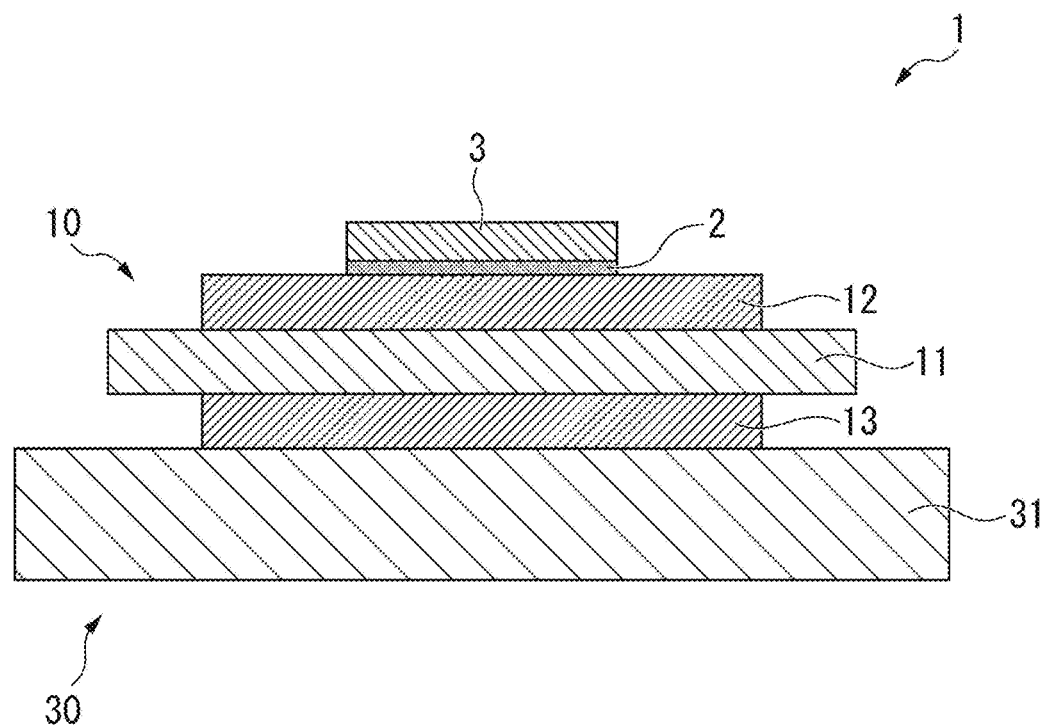
FIG. 1 is a schematic explanatory view of a power module including an insulating circuit substrate with a heat sink according to a first embodiment of the present invention.

FIG. 1 shows a power module 1 in which an insulating circuit substrate with a heat sink 30, which is a first embodiment of the present invention, is used.

This power module 1 includes the insulating circuit substrate with a heat sink 30 and a semiconductor element 3 bonded to one surface (upper surface in FIG. 1) of the insulating circuit substrate with a heat sink 30 through a solder layer 2.

The semiconductor element 3 is made of a semiconductor material such as Si. As the first solder layer 2 that bonds the insulating circuit substrate with a heat sink 30 and the semiconductor element 3, for example, a Sn—Ag-based, Sn—Cu-based, Sn—In-based, or Sn—Ag—Cu-based solder material (so-called lead-free solder material) is used.

The insulating circuit substrate with a heat sink 30 includes an insulating circuit substrate 10 and a heat sink 31 bonded to the insulating circuit substrate 10.

The insulating circuit substrate 10 includes a ceramic substrate 11 that configures an insulating layer, a circuit layer 12 disposed on one surface (upper surface in FIG. 1) of the ceramic substrate 11, and a metal layer 13 disposed on the other surface (lower surface in FIG. 1) of the ceramic substrate 11.

The ceramic substrate 11 is made of ceramic that is excellent in terms of an insulating property and a heat radiation such as silicon nitride ($Si_3N_4$), aluminum nitride (AlN), or alumina ($Al_2O_3$). In the present embodiment, the ceramic substrate 11 is made of aluminum nitride (AlN) that is particularly excellent in terms of the heat radiation. In addition, the thickness of the ceramic substrate 11 is set to be in a range of, for example, 0.2 mm or more and 1.5 mm or less and, in the present embodiment, set to 0.635 mm.

Figure 5:
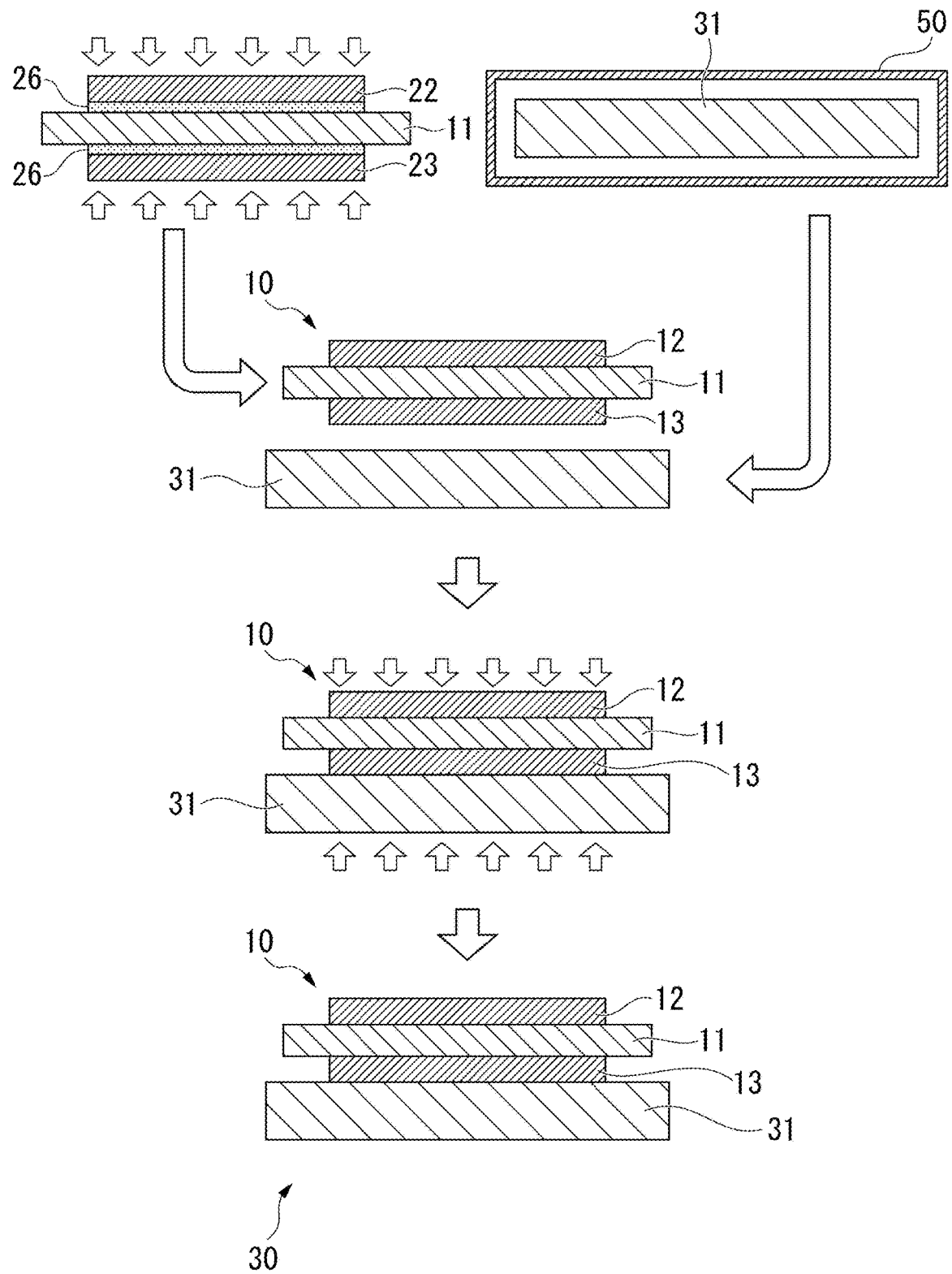
FIG. 5 is a schematic explanatory view of the method for manufacturing the insulating circuit substrate with a heat sink according to the first embodiment.

The circuit layer 12 is formed by bonding a copper plate 22 made of copper or a copper alloy to one surface (upper surface in FIG. 5) of the ceramic substrate 11 as shown in FIG. 5. In the present embodiment, the circuit layer 12 is formed by bonding a rolled plate of oxygen-free copper to the ceramic substrate 11. The thickness of the copper plate 22 that serves as the circuit layer 12 is set to be in a range of 0.1 mm or more and 1.0 mm or less and, in the present embodiment, set to 0.6 mm.

The metal layer 13 is formed by bonding a copper plate 23 made of copper or a copper alloy to the other surface (lower surface in FIG. 5) of the ceramic substrate 11 as shown in FIG. 5. In the present embodiment, the metal layer 13 is formed by bonding a rolled plate of oxygen-free copper to the ceramic substrate 11. The thickness of the copper plate 23 that serves as the metal layer 13 is set to be in a range of 0.1 mm or more and 1.0 mm or less and, in the present embodiment, set to 0.6 mm.

The heat sink 31 is a member for dissipating heat from the insulating circuit substrate 10, and, in the present embodiment, is used as a heat radiation plate as shown in FIG. 1.

In this heat sink 31, at least the bonding surface that is to be bonded to the metal layer 13 of the insulating circuit substrate 10 is made of an Al—Mn-based alloy containing Mn. In the present embodiment, the heat sink 31 is fully made of an Al—Mn-based alloy.

Here, in the present embodiment, the heat sink 31 made of an Al—Mn-based alloy containing Mn and the metal layer 13 made of copper or a copper alloy are bonded to each other by solid phase diffusion bonding.

In the bonded interface between the heat sink 31 and the metal layer 13, an intermetallic compound layer made of an intermetallic compound of Cu and Al is formed, and this intermetallic compound layer has a configuration in which intermetallic compounds having a plurality of phases are laminated together.

In the present embodiment, the Mn concentration $C_0$ of the entire Al—Mn-based alloy that configures the heat sink 31 is set to be in a range of 0.4 mass % or more and 1.5 mass % or less.

The lower limit of the Mn concentration $C_0$ of the entire Al—Mn-based alloy is preferably 0.6 mass % or more and more preferably 0.8 mass % or more. On the other hand, the upper limit of the Mn concentration $C_0$ of the entire Al—Mn-based alloy is preferably 1.3 mass % or less and more preferably 1.1 mass % or less.

Figure 2:
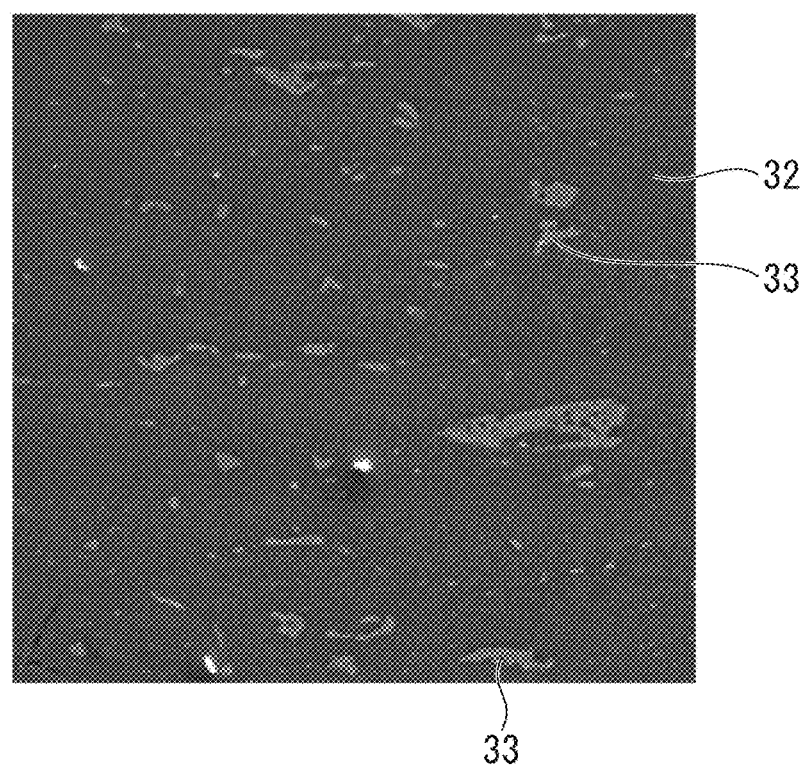
FIG. 2 is a photograph of an observed cross section of a heat sink in the insulating circuit substrate with a heat sink shown in FIG. 1.

Here, FIG. 2 shows the composition of the Al—Mn-based alloy of the heat sink 31.

As shown in FIG. 2, the Al—Mn-based alloy of the heat sink 31 has a composition in which Mn-containing precipitates 33 are dispersed in a Cu matrix 32.

In addition, in a case where the Mn concentration in a region (Cu matrix 32) excluding the Mn-containing precipitates 33 in the Al—Mn-based alloy of the heat sink 31 is defined as the Mn solid solution concentration $C_1$ and the value obtained by subtracting the Mn solid solution concentration $C_1$ from the Mn concentration $C_0$ of the entire Al—Mn-based alloy is defined as the Mn precipitate concentration $C_2$, the ratio $C_1/C_2$ of the Mn solid solution concentration $C_1$ to the Mn precipitate concentration $C_2$ is set to be in a range of 0.1 or more and 2.7 or less.

The upper limit of the ratio $C_1/C_2$ of the Mn solid solution concentration $C_1$ to the Mn precipitate concentration $C_2$ is preferably 2.1 or less and more preferably 1.0 or less.

The Mn concentration $C_0$ of the entire Al—Mn-based alloy can be measured by dissolving a measurement specimen in an acid and performing an ICP emission spectroscopic analysis.

In addition, the Mn solid solution concentration $C_1$, which is the Mn concentration in the region (Cu matrix 32) excluding the Mn-containing precipitates 33 in the Al—Mn-based alloy, can be measured by observing the Al—Mn-based alloy using EPMA and performing a quantitative analysis on the region (Cu matrix 32) excluding the Mn-containing precipitates 33.

In the present embodiment, in the Al—Mn-based alloy that configures the heat sink 31, since the ratio $C_1/C_2$ of the Mn solid solution concentration $C_1$ to the Mn precipitate concentration $C_2$ is set to be in a range of 0.1 or more and 2.7 or less, the amount of the Mn solid solution is suppressed to be small, and a state in which the Mn-containing precipitates 33 are sufficiently dispersed is formed.

In the present embodiment, in a state in which the heat sink 31 is bonded to the metal layer 13 by solid phase diffusion bonding, the dispersion state of the Mn-containing precipitates 33 in the Al—Mn-based alloy that configures the heat sink 31 is defined as described above.

In addition, in the present embodiment, the total concentration of Cu, Si, and Fe in the Al—Mn-based alloy that configures the heat sink 31 may be 1.5 mass % or less. That is, in the present embodiment, the total amount of Cu, Si, and Fe that are contained as impurities in the Al—Mn-based alloy that configures the heat sink 31 is defined as described above.

The total concentration of Cu, Si, and Fe in the Al—Mn-based alloy that configures the heat sink 31 is preferably 1.3 mass % or less and more preferably 1.1 mass % or less. In addition, the amount of each of Cu, Si, and Fe is preferably set to 0.8 mass % or less and more preferably set to 0.5 mass % or less.

Figure 4:
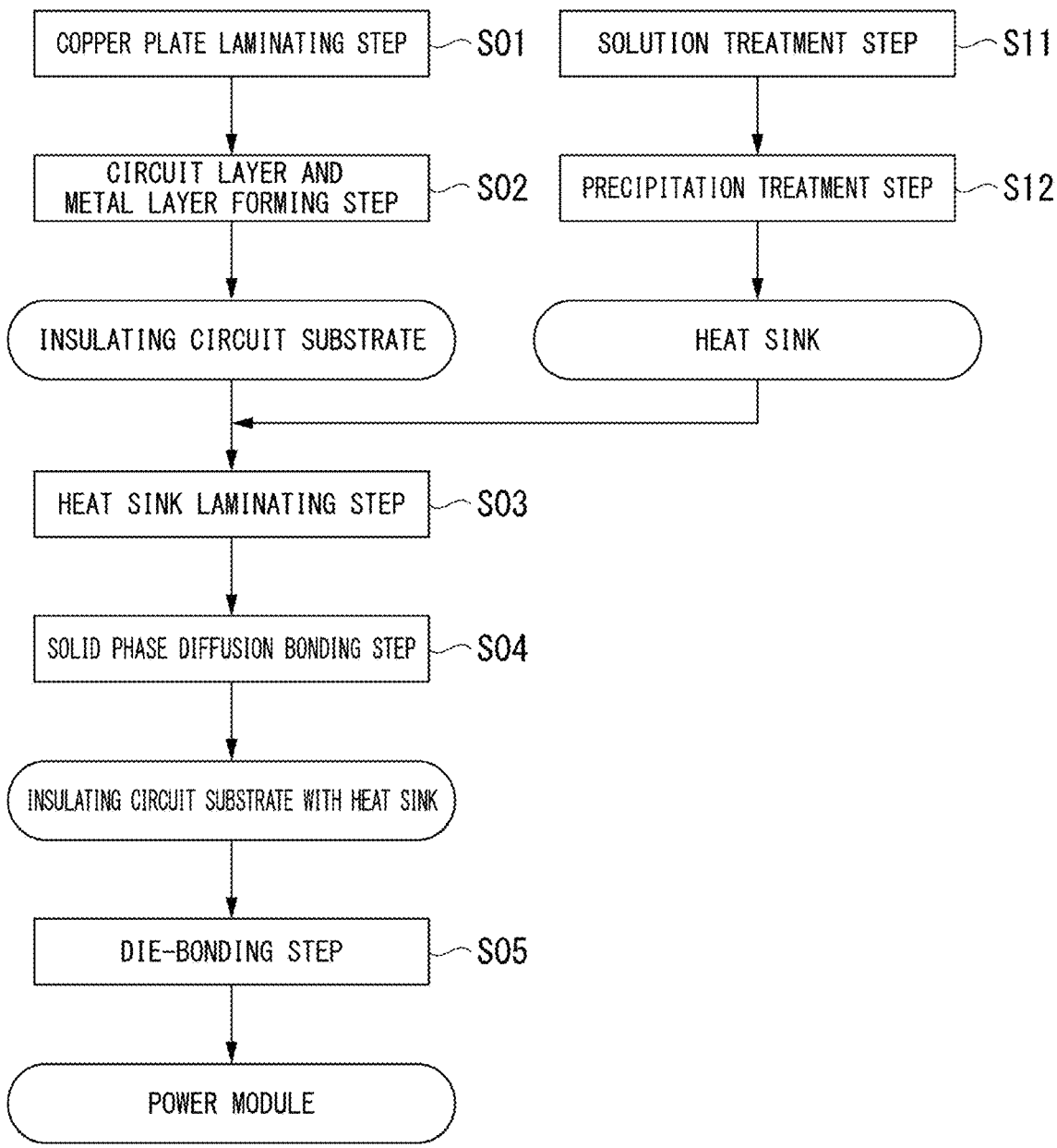
FIG. 4 is a flowchart showing a method for manufacturing the insulating circuit substrate with a heat sink according to the first embodiment.

Next, a method for manufacturing the insulating circuit substrate with a heat sink 30, which is the present embodiment, will be described with reference to FIG. 4 and FIG. 5.

(Copper Plate Laminating Step S01)

As shown in FIG. 5, in a copper plate laminating step S01, the copper plate 22 that serves as the circuit layer 12 is laminated on one surface of the ceramic substrate 11 through an active brazing material 26, and the copper plate 23 that serves as the metal layer 13 is laminated on the other surface of the ceramic substrate 11 through an active brazing material 26. In the present embodiment, as the active brazing material 26, a paste of an Ag-27 mass % Cu-1.5 mass % Ti alloy was used.

(Circuit Layer and Metal Layer Forming Step S02)

In a circuit layer and a metal layer forming step S02, the laminated copper plate 22, ceramic substrate 11, and copper plate 23 are charged and heated in a vacuum heating furnace in a state of being pressurized in the lamination direction in a range of 1 kgf/cm² or more and 35 kgf/cm² or less (0.1 MPa or more and 3.5 MPa or less), the copper plate 22 and the ceramic substrate 11 are bonded to each other to form the circuit layer 12, and the copper plate 23 and the ceramic substrate 11 are bonded to each other to form the metal layer 13.

Here, it is preferable that the pressure in the vacuum heating furnace is set to be in a range of $10^{-6}$ Pa or more and $10^{-3}$ Pa or less, the heating temperature is set to be in a range of 790° C. or higher and 850° C. or lower, and the holding time at the heating temperature is set to be in a range of 5 minutes or longer and 60 minutes or shorter.

As a result, the insulating circuit substrate 10, which is the present embodiment, is manufactured.

(Solution Treatment Step S11)

Meanwhile, in a solution treatment step S11, a rolled plate made of an Al—Mn-based alloy that serves as the heat sink 31 is charged into a heat treatment furnace 50 and thermally treated under conditions of a heating temperature of 590° C. or higher and 640° C. or lower and a holding time at the heating temperature of 45 minutes or longer and 240 minutes or shorter, the cooling rate from the heating temperature to 200° C. is set to 30° C./min or more, and an Mn solid solution is sufficiently formed in an Al matrix.

The lower limit of the heating temperature in the solution treatment step S11 is preferably set to 600° C. or higher and more preferably set to 610° C. or higher. On the other hand, the upper limit of the heating temperature is preferably set to 635° C. or lower and more preferably set to 630° C. or lower.

The lower limit of the holding time at the heating temperature is preferably set to 60 minutes or longer and more preferably set to 90 minutes or longer. On the other hand, the upper limit of the holding time is preferably set to 180 minutes or shorter and more preferably set to 150 minutes or shorter.

The cooling rate from the heating temperature to 200° C. is preferably set to 50° C./min or more and more preferably set to 100° C./min or more.

(Precipitation Treatment Step S12)

Figure 3:
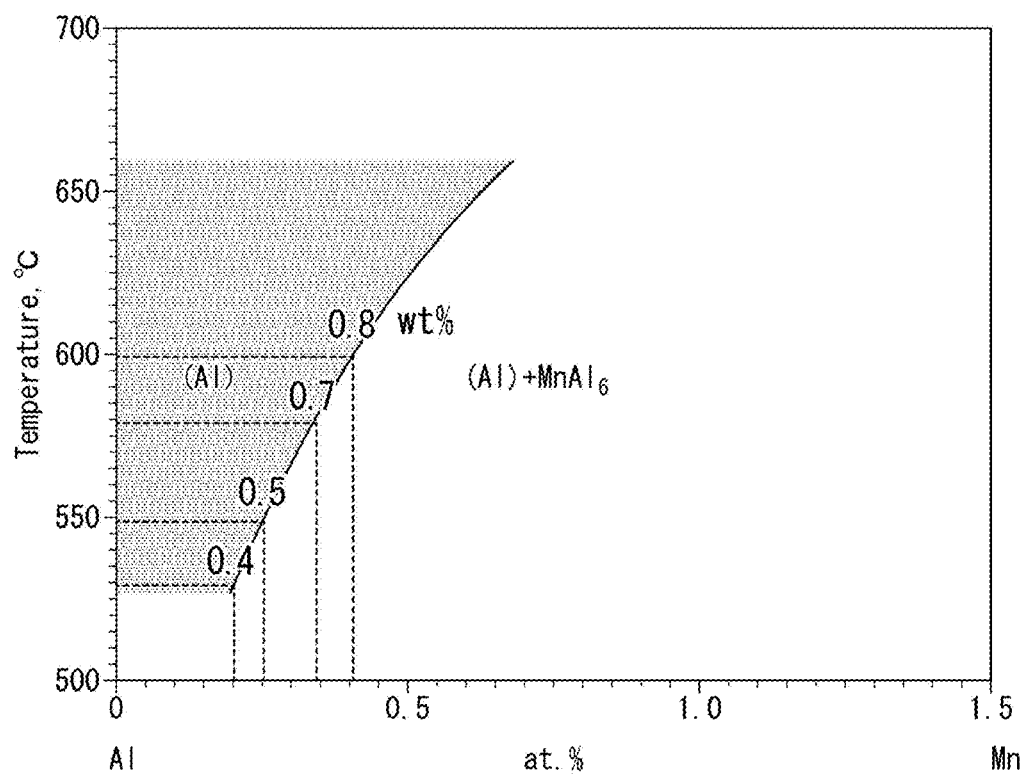
FIG. 3 is a partial enlarged view of a binary phase diagram of Al and Mn.

Next, in a precipitation treatment step S12, the rolled plate (heat sink 31) that has undergone the solution treatment is charged into the heat treatment furnace 50 and thermally treated under conditions of a heating temperature of 500° C. or higher and 560° C. or lower and a holding time at the heating temperature of 30 hours or longer and 150 hours or shorter, the Mn-containing precipitates 33 are sufficiently precipitated, and the amount of a solid solution of Mn is sufficiently decreased. At this time, it is preferable to calculate the solid solubility limit of Mn at the equilibrium state from the binary phase diagram of Al and Mn shown in FIG. 3 and obtain a temperature condition at which the Mn solid solution concentration $C_1$ reaches the target value.

Here, the upper limit of the heating temperature in the precipitation treatment step S12 is preferably set to 540° C. or lower and more preferably set to 520° C. or lower.

The lower limit of the holding time at the heating temperature is preferably set to 50 hours or longer and more preferably set to 120 hours or longer.

(Heat Sink Laminating Step S03)

Next, in a heat sink laminating step S03, the metal layer 13 of the insulating circuit substrate 10 is laminated with the rolled plate (heat sink 31) that has been subjected to the solution treatment step S11 and the precipitation treatment step S12 to form a laminate.

The bonding surfaces of the metal layer 13 and the heat sink 31 are each flattened by removing damage on the surfaces in advance.

(Solid Phase Diffusion Bonding Step S04)

Next, in a solid phase diffusion bonding step S04, the above-described laminate is pressurized (at a pressure of 3 to 35 kgf/cm$^2$ (0.3 to 3.5 MPa)) in the lamination direction and heated to bond the metal layer 13 and the heat sink 31 to each other by solid phase diffusion bonding.

Here, in the solid phase diffusion bonding step S04, it is preferable that the heating temperature is set to be in a range of 450° C. or higher and lower than 520° C. and the holding time at the heating temperature is set to be in a range of 30 minutes or longer and 240 minutes or shorter.

During pressurization and heating in the solid phase diffusion bonding step S04, an ohmic heating device or a hot press device is preferably used.

The insulating circuit substrate with a heat sink 30, which is the present embodiment, is manufactured as described above.

(Die-Bonding Step S05)

Next, in a die-bonding step S05, the semiconductor element 3 is laminated on one surface (front surface) of the circuit layer 12 through a solder material and bonded in a reducing furnace with solder.

The power module 1, which is the present embodiment, is manufactured as described above.

According to the insulating circuit substrate with a heat sink 30 according to the present embodiment configured as described above, in a case where the value obtained by subtracting the Mn solid solution concentration $C_1$ from the Mn concentration $C_0$ of the entire Al—Mn-based alloy that configures the heat sink 31 is defined as the Mn precipitate concentration $C_2$, the ratio $C_1/C_2$ of the Mn solid solution concentration $C_1$ to the Mn precipitate concentration $C_2$ is set to be in a range of 0.1 or more and 2.7 or less. Therefore, in the heat sink 31 made of the Al—Mn-based alloy, the Mn-containing precipitates 33 are sufficiently dispersed, the amount of the Mn solid solution is small, the strength of the heat sink 31 is secured, and the thermal conductivity is sufficiently secured.

Therefore, it is possible to efficiently transfer heat spread in the metal layer 13 made of the copper plate 23 toward the heat sink 31, and it becomes possible to provide the insulating circuit substrate with a heat sink 30 having an excellent heat radiation characteristic.

In addition, in the present embodiment, in a case where the total concentration of Cu, Si, and Fe in the Al—Mn-based alloy that configures the heat sink 31 is set to 1.5 mass % or less, it becomes possible to promote the formation of the Mn-containing precipitates 33. Therefore, in the Al—Mn-based alloy that configures the heat sink 31, it is possible to decrease the amount of the Mn solid solution and to more sufficiently secure the thermal conductivity of the heat sink 31.

Second Embodiment

Figure 6:
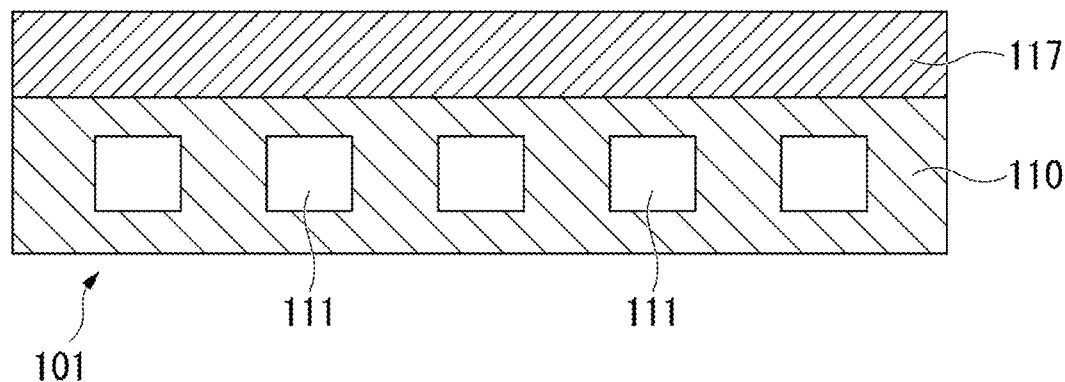
FIG. 6 is a schematic explanatory view of a heat sink according to a second embodiment of the present invention.

Next, a heat sink, which is a second embodiment of the present invention, will be described. FIG. 6 shows a heat sink 101 according to the second embodiment of the present invention.

Figure 8:
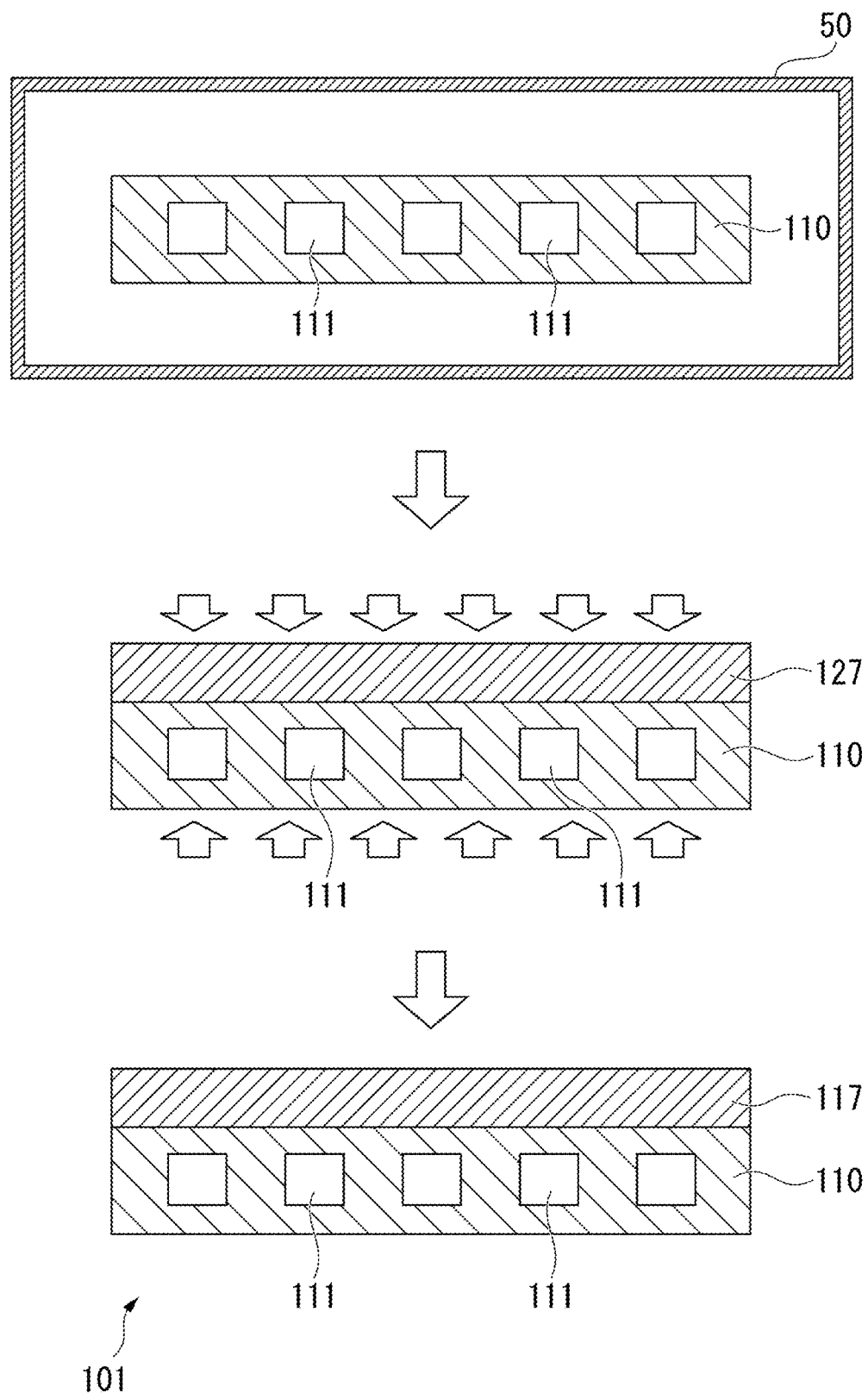
FIG. 8 is a schematic explanatory view of the method for manufacturing the heat sink according to the second embodiment.

This heat sink 101 includes a heat sink main body 110 and a copper member layer 117 that is laminated on one surface (upper side in FIG. 6) of the heat sink main body 110 and is made of copper or a copper alloy. In the present embodiment, the copper member layer 117 is configured by bonding a copper plate 127 made of a rolled plate of oxygen-free copper as shown in FIG. 8.

The heat sink main body 110 is provided with passages 111 through which a cooling medium flows. In the heat sink main body 110, at least the bonding surface that is to be bonded to the copper member layer 117 is made of an Al—Mn-based alloy containing Mn. In the present embodiment, the heat sink main body 110 is fully made of the above-described Al—Mn-based alloy.

Here, in the present embodiment, the heat sink main body 110 made of the Al—Mn-based alloy containing Mn and the copper member layer 117 made of copper or a copper alloy are bonded to each other by solid phase diffusion bonding.

In the bonded interface between the heat sink main body 110 and the copper member layer 117, an intermetallic compound layer made of an intermetallic compound of Cu and Al is formed, and this intermetallic compound layer has a configuration in which intermetallic compounds having a plurality of phases are laminated together.

In addition, in the present embodiment, the Mn concentration $C_0$ of the entire Al—Mn-based alloy that configures the heat sink main body 110 is set to be in a range of 0.4 mass % or more and 1.5 mass % or less.

The lower limit of the Mn concentration $C_0$ of the entire Al—Mn-based alloy is preferably 0.6 mass % or more and more preferably 0.8 mass % or more. On the other hand, the upper limit of the Mn concentration $C_0$ of the entire Al—Mn-based alloy is preferably 1.3 mass % or less and more preferably 1.1 mass % or less.

Furthermore, in a case where the Mn concentration in a region excluding precipitates in the Al—Mn-based alloy of the heat sink main body 110 is defined as the Mn solid solution concentration $C_1$ and the value obtained by subtracting the Mn solid solution concentration $C_1$ from the Mn concentration $C_0$ of the entire Al—Mn-based alloy is defined as the Mn precipitate concentration $C_2$, the ratio $C_1/C_2$ of the Mn solid solution concentration $C_1$ to the Mn precipitate concentration $C_2$ is set to be in a range of 0.1 or more and 2.7 or less.

The upper limit of the ratio $C_1/C_2$ of the Mn solid solution concentration $C_1$ to the Mn precipitate concentration $C_2$ is preferably 2.1 or less and more preferably 1.0 or less.

In the present embodiment, in the Al—Mn-based alloy that configures the heat sink main body 110, since the ratio $C_1/C_2$ of the Mn solid solution concentration $C_1$ to the Mn precipitate concentration $C_2$ is set to be in a range of 0.1 or more and 2.7 or less, the amount of the Mn solid solution is suppressed to be small, and a state in which the Mn-containing precipitates are sufficiently dispersed is formed.

In the present embodiment, in a state in which the heat sink main body 110 is bonded to the copper member layer 117 by solid phase diffusion bonding, the dispersion state of the Mn-containing precipitates in the Al—Mn-based alloy that configures the heat sink main body 110 is defined as described above.

In addition, in the present embodiment, the total concentration of Cu, Si, and Fe in the Al—Mn-based alloy that configures the heat sink main body 110 may be 1.5 mass % or less. That is, in the present embodiment, the total amount of Cu, Si, and Fe that are contained as impurities in the Al—Mn-based alloy that configures the heat sink main body 110 is defined as described above.

Figure 7:
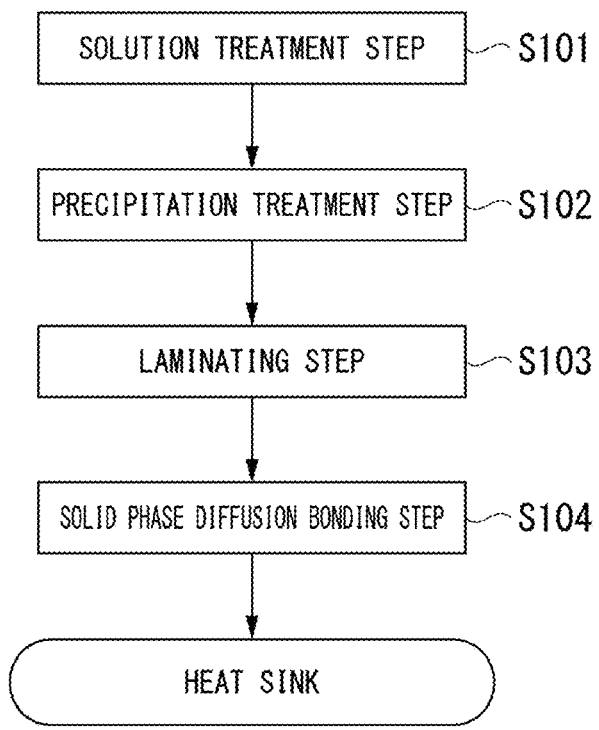
FIG. 7 is a flowchart showing a method for manufacturing the heat sink according to the second embodiment.

Next, a method for manufacturing the heat sink 101, which is the present embodiment, will be described with reference to FIG. 7 and FIG. 8.

(Solution Treatment Step S101)

First, in a solution treatment step S101, the heat sink main body 110 made of the Al—Mn-based alloy is charged into a heat treatment furnace 50, thermally treated under conditions of a heating temperature of 590° C. or higher and 640° C. or lower and a holding time at the heating temperature of 45 minutes or longer and 240 minutes or shorter, and cooled to 200° C. at a cooling rate of 30° C./min or more, and an Mn solid solution is sufficiently formed in an Al matrix.

(Precipitation Treatment Step S102)

Next, in a precipitation treatment step S102, the heat sink main body step 110 that has been subjected to the solution treatment step S101 is charged into the heat treatment furnace 50 and thermally treated under conditions of a heating temperature of 500° C. or higher and 560° C. or lower and a holding time at the heating temperature of 30 hours or longer and 150 hours or shorter, the Mn-containing precipitates are sufficiently precipitated, and the amount of a solid solution of Mn is sufficiently decreased. At this time, it is preferable to calculate the solid solubility limit of Mn at the equilibrium state from the binary phase diagram of Al and Mn shown in FIG. 3 and obtain a temperature condition at which the Mn solid solution concentration $C_1$ reaches the target value.

(Laminating Step S103)

Next, in a laminating step S103, the copper plate 127 that serves as the copper member layer 117 and the heat sink main body 110 that has been subjected to the solution treatment step S101 and the precipitation treatment step S102 are laminated to form a laminate.

The bonding surfaces of the copper plate 127 that serves as the copper member layer 117 and the heat sink main body 110 are each flattened by removing damage on the surfaces in advance.

(Solid Phase Diffusion Bonding Step S104)

Next, as shown in FIG. 8, in a solid phase diffusion bonding step S104, the laminate in which the heat sink main body 110 and the copper plate 127 that serves as the copper member layer 117 are laminated is disposed and heated in a vacuum heating furnace in a state of being pressurized (at a pressure of 5 to 35 kgf/cm² (0.5 to 3.5 MPa)) in the lamination direction, thereby bonding the copper plate 127 and the heat sink main body 110 by solid phase diffusion bonding.

Here, it is preferable that the pressure in the vacuum heating furnace is set to be in a range of $10^{-6}$ Pa or more and $10^{-3}$ Pa or less, the heating temperature is set to be in a range of 450° C. or higher and 520° C. or lower, and the holding time at the heating temperature is set to be in a range of 30 minutes or longer and 240 minutes or shorter.

The heat sink 101, which is the present embodiment, is manufactured as described above.

According to the heat sink 101 according to the present embodiment configured as described above, since the copper member layer 117 is formed by bonding the copper plate 127 made of a rolled plate of oxygen-free copper to one surface of the heat sink main body 110, it is possible to spread heat in the surface direction through the copper member layer 117 and to significantly improve the heat radiation characteristic.

In addition, in the present embodiment, in a case where the value obtained by subtracting the Mn solid solution concentration $C_1$ from the Mn concentration $C_0$ of the entire Al—Mn-based alloy that configures the heat sink main body 110 is defined as the Mn precipitate concentration $C_2$, since the ratio $C_1/C_2$ of the Mn solid solution concentration $C_1$ to the Mn precipitate concentration $C_2$ is set to be in a range of 0.1 or more and 2.7 or less, in the heat sink main body 110 made of the Al—Mn-based alloy, the Mn-containing precipitates are sufficiently dispersed, the amount of the Mn solid solution is small, the strength of the heat sink main body 110 is secured, and the thermal conductivity is sufficiently secured.

Therefore, it is possible to efficiently transfer heat spread in the copper member layer 117 toward the heat sink main body 110, and it becomes possible to provide the heat sink 101 having an excellent heat radiation characteristic.

In addition, in the present embodiment, in a case where the total concentration of Cu, Si, and Fe in the Al—Mn-based alloy that configures the heat sink main body 110 is set to 1.5 mass % or less, it becomes possible to promote the formation of the Mn-containing precipitates. Therefore, in the Al—Mn-based alloy that configures the heat sink main body 110, it is possible to decrease the amount of the Mn solid solution and to more sufficiently secure the thermal conductivity of the heat sink main body 110.

Hitherto, the embodiments of the present invention have been described, but the present invention is not limited thereto and can be appropriately modified within the scope of the technical concept of the invention.

For example, in the first embodiment, the circuit layer and the metal layer have been described as being formed by bonding the copper plate, but the configuration is not limited thereto, and the circuit layer may be made of aluminum or an aluminum alloy.

In addition, at least one or both of the circuit layer and the metal layer may have a structure in which an aluminum layer and a copper layer are laminated.

Furthermore, as the copper plate that configures the metal layer and the like, the rolled plate of oxygen-free copper has been described as an example, but the material is not limited thereto, and the copper plate may be made of different copper or a different copper alloy.

In addition, in the first embodiment, the power module has been described as being formed by mounting the semiconductor element on the insulating circuit substrate, but the configuration is not limited thereto. For example, an LED module may be formed by mounting an LED element on the circuit layer of the insulating circuit substrate or a thermoelectric module may be formed by mounting a thermoelectric element on the circuit layer of the insulating circuit substrate.

Furthermore, in the first embodiment, the insulating layer has been described as being made of a ceramic substrate, but the configuration is not limited thereto, and the insulating layer may be made of a resin or the like.

In addition, in the first embodiment, the ceramic substrate and the copper plate have been described as being bonded to each other using the active brazing material, but the method for bonding the ceramic substrate and the copper plate is not particularly limited.

EXAMPLES

Hereinafter, the results of confirmatory experiments performed to confirm the effect of the present invention will be described.

(Production of Test Pieces)

In Present Invention Examples 1 to 10, aluminum plates (50 mm×50 mm, 5 mm in thickness) were prepared by cutting an aluminum ingot into a predetermined shape and subjecting the aluminum ingot to a solution treatment and a precipitation treatment under conditions shown in Table 1. A copper plate made of oxygen-free copper (40 mm×40 mm, 5 mm in thickness) was bonded to one surface of each of the aluminum plates by solid phase diffusion bonding by the method described in the above-described embodiments.

In Comparative Examples 1 and 2, aluminum plates (50 mm×50 mm, 5 mm in thickness) were prepared by cutting an aluminum ingot into a predetermined shape without subjecting the aluminum ingot to a solution treatment and a precipitation treatment. A copper plate made of oxygen-free copper (40 mm×40 mm, 5 mm in thickness) was bonded to one surface of each of the aluminum plates by solid phase diffusion bonding by the method described in the above-described embodiments.

Here, in Present Invention Examples 1 to 10 and Comparative Examples 1 and 2, one of the aluminum plates and the copper plate were pressurized in the lamination direction with a load of 15 kgf/cm² (1.5 MPa) and bonded to each other by solid phase diffusion bonding in a vacuum heating furnace under conditions of 500° C. for 180 minutes.

(Mn Concentrations $C_0$ of Entire Aluminum Plates)

The Mn concentrations $C_0$ of the entire aluminum plates of the obtained bonded bodies were measured as follows. A measurement specimen collected from each of the aluminum plates was put into a fluororesin container and was heated and decomposed by adding hydrochloric acid thereto. After that, nitric acid and hydrofluoric acid were added thereto to further decompose the measurement specimen. The measurement specimen was set to a predetermined volume, and the Mn concentration $C_0$ of the entire Al—Mn-based alloy was measured using an ICP emission spectroscopic analyzer.

(Mn Solid Solution Concentrations $C_1$ and Mn Precipitate Concentrations $C_2$ of Aluminum Plates)

A measurement specimen was collected from each of the aluminum plates of the obtained bonded bodies, this measurement specimen was mirror-polished and observed using EPMA. A quantitative analysis was performed at 10 points in the region excluding precipitates with an accelerated voltage of 10 kV and an analysis diameter of 1 μm, and the average value thereof was regarded as the Mn solid solution concentration $C_1$.

The Mn precipitate concentration $C_2$ was calculated by subtracting the Mn solid solution concentration $C_1$ from the Mn concentration $C_0$ of the entire aluminum plate.

The Mn precipitate concentration $C_2$ was measured at 5 visual fields in a region of 100 μm×100 μm, and the average value thereof was adopted.

(Measurement of Heat Resistances)

A heater chip (13 mm×10 mm×0.25 mm) was soldered to the surface of the copper plate, and the aluminum plate was bonded to a cooler by brazing. Next, the heater chip was heated with a power of 100 W, and the temperature of the heater chip was measured using a thermocouple. In addition, the temperature of a cooling medium (ethylene glycol:water=9:1) flowing in the cooler was measured. In addition, a value obtained by dividing the difference between the temperature of the heater chip and the temperature of the cooling medium by the power was regarded as the heat resistance.

The heat resistance before the heat cycle test in Comparative Example 1 was regarded as 1 as a reference, and the heat resistances in other examples were evaluated using the ratios of those to the heat resistance in Comparative Example 1. The evaluation results are shown in Table 2.

TABLE 1

| | | Material of aluminum plate | Material of copper plate | Solution treatment step | | | Precipitation treatment step | |
|---|---|---|---|---|---|---|---|---|
| | | | | Heating temperature (° C.) | Holding time (min) | Cooling rate* (° C./min) | Heating temperature (° C.) | Holding time (min) |
| Present Invention Example | 1 | Al-0.6 mass % Mn | OFC | 590 | 180 | 50 | 530 | 35 |
| | 2 | Al-1.2 mass % Mn | OFC | 635 | 150 | 50 | 530 | 50 |
| | 3 | Al-0.8 mass % Mn | OFC | 600 | 60 | 30 | 540 | 50 |
| | 4 | Al-0.6 mass % Mn | OFC | 590 | 90 | 30 | 520 | 60 |
| | 5 | Al-0.9 mass % Mn | OFC | 640 | 240 | 50 | 550 | 50 |
| | 6 | Al-0.4 mass % Mn | OFC | 610 | 150 | 50 | 510 | 40 |
| | 7 | Al-1.5 mass % Mn | TPC | 590 | 90 | 30 | 500 | 40 |
| | 8 | Al-1.5 mass % Mn | TPC | 610 | 150 | 100 | 500 | 150 |
| | 9 | Al-0.5 mass % Mn | Phosphorous deoxidized copper | 630 | 45 | 50 | 520 | 30 |
| | 10 | A3003 | Phosphorous deoxidized copper | 640 | 180 | 30 | 560 | 120 |
| Comparative Example | 1 | Al-0.6 mass % Mn | OFC | — | — | — | — | — |
| | 2 | Al-1.8 mass % Mn | OFC | — | — | — | — | — |

* Cooling rate from heating temperature to 200° C.

TABLE 2

| | | Mn concentration of aluminum plate (mass %) | | | | |
|---|---|---|---|---|---|---|
| | | Entire $C_0$ | Mn solid solution $C_1$ | Mn precipitate $C_2$ | $C_1/C_2$ | Heat resistance ratio |
| Present Invention Example | 1 | 0.6 | 0.39 | 0.19 | 2.1 | 0.96 |
| | 2 | 1.2 | 0.19 | 1.02 | 0.2 | 0.88 |
| | 3 | 0.8 | 0.38 | 0.38 | 1.0 | 0.95 |
| | 4 | 0.6 | 0.29 | 0.34 | 0.9 | 0.92 |
| | 5 | 0.9 | 0.37 | 0.49 | 0.8 | 0.95 |
| | 6 | 0.4 | 0.30 | 0.14 | 2.1 | 0.92 |
| | 7 | 1.5 | 0.24 | 1.28 | 0.2 | 0.89 |
| | 8 | 1.5 | 0.13 | 1.34 | 0.1 | 0.86 |
| | 9 | 0.5 | 0.36 | 0.13 | 2.7 | 0.94 |
| | 10 | 1.4 | 0.38 | 1.03 | 0.4 | 0.95 |

TABLE 2-continued

| | | Mn concentration of aluminum plate (mass %) | | | |
|---|---|---|---|---|---|
| | | Entire $C_0$ | Mn solid solution $C_1$ | Mn precipitate $C_2$ | $C_1/C_2$ | Heat resistance ratio |
| Comparative | 1 | 0.6 | 0.62 | 0.01 | 62.0 | 1.00 |
| Example | 2 | 1.8 | 1.78 | 0.04 | 44.5 | 1.05 |

In Comparative Example 1 in which the test piece was made of an aluminum alloy containing 0.6 mass % of Mn and was not subjected to any solution treatment and any precipitation treatment, the ratio $C_1/C_2$ of the Mn solid solution concentration $C_1$ to the Mn precipitate concentration $C_2$ became 62.0, which was above the range of the present invention, and the heat resistance became relatively large.

In Comparative Example 2 in which the test piece was made of an aluminum alloy containing 1.8 mass % of Mn and was not subjected to any solution treatment and any precipitation treatment, the Mn solid solution concentration $C_1$ was as high as 1.78 mass %, and the heat resistance became higher than that in Comparative Example 1.

In contrast, in Present Invention Examples 1 to 10 in which the test pieces were made of an aluminum alloy containing Mn in a range of 0.4 mass % or more and 1.5 mass % or less and were subjected to the solution treatment and the precipitation treatment, the ratios $C_1/C_2$ of the Mn solid solution concentration $C_1$ to the Mn precipitate concentration $C_2$ fell in a range of 0.1 or more and 2.7 or less, and the heat resistance became smaller than that in Comparative Example 1.

As a result of the above-described confirmatory experiments, it was confirmed that, according to the present invention examples, it becomes possible to provide a bonded body capable of suppressing a decrease in the thermal conductivity of an aluminum member even in a case where the aluminum member made of an Al—Mn-based alloy and a copper member made of copper or a copper alloy are bonded to each other.

REFERENCE SIGNS LIST

10 Insulating circuit substrate (bonded body)
11 Ceramic substrate
13 Metal layer (copper member)
31 Heat sink (aluminum member)
101 heat sink (bonded body)
110 Heat sink main body (aluminum member)
117 Copper member layer

What is claimed is:
1. A bonded body comprising:
an aluminum member made of an aluminum alloy; and
a copper member made of copper or a copper alloy, the aluminum member and the copper member being bonded to each other by solid phase diffusion bonding,
wherein the aluminum member is made of an Al—Mn-based alloy containing Mn, an Mn concentration $C_0$ of an entirety of the aluminum member is in a range of 0.4 mass % or more and 1.5 mass % or less,
a total concentration of Cu, Si, and Fe in the aluminum member is 1.5 mass % or less,
when an Mn concentration in a region excluding a precipitate in the aluminum member is defined as an Mn solid solution concentration $C_1$ and a value obtained by subtracting the Mn solid solution concentration $C_1$ from the Mn concentration $C_0$ of the entire aluminum member is defined as an Mn precipitate concentration $C_2$,
a ratio $C_1/C_2$ of the Mn solid solution concentration $C_1$ to the Mn precipitate concentration $C_2$ is in a range of 0.1 or more and 2.7 or less.
2. An insulating circuit substrate with a heat sink comprising:
an insulating layer;
a circuit layer formed on one surface of the insulating layer;
a metal layer formed on the other surface of the insulating layer; and
a heat sink disposed on a surface of the metal layer opposite to the insulating layer,
wherein a bonding surface of the metal layer with the heat sink is made of copper or a copper alloy,
a bonding surface of the heat sink with the metal layer is made of an Al—Mn-based alloy containing Mn, an Mn concentration $C_0$ of an entirety of the Al—Mn-based alloy is in a range of 0.4 mass % or more and 1.5 mass % or less,
a total concentration of Cu, Si, and Fe in the Al—Mn-based alloy of the heat sink is 1.5 mass % or less,
when an Mn concentration in a region excluding a precipitate in the Al—Mn-based alloy of the heat sink is defined as an Mn solid solution concentration $C_1$ and a value obtained by subtracting the Mn solid solution concentration $C_1$ from the Mn concentration $C_0$ of an entirety of the Al—Mn-based alloy is defined as an Mn precipitate concentration $C_2$,
a ratio $C_1/C_2$ of the Mn solid solution concentration $C_1$ to the Mn precipitate concentration $C_2$ is in a range of 0.1 or more and 2.7 or less.
3. A heat sink comprising:
a heat sink main body; and
a copper member layer that is bonded to the heat sink main body and is made of copper or a copper alloy,
a bonding surface of the heat sink main body with the copper member layer is made of an Al—Mn-based alloy containing Mn, an Mn concentration $C_0$ of an entirety of the Al—Mn-based alloy is in a range of 0.4 mass % or more and 1.5 mass % or less,
a total concentration of Cu, Si, and Fe in the Al—Mn-based alloy of the heat sink main body is 1.5 mass % or less,
when an Mn concentration in a region excluding a precipitate in the Al—Mn-based alloy of the heat sink main body is defined as an Mn solid solution concentration $C_1$ and a value obtained by subtracting the Mn solid solution concentration $C_1$ from the Mn concentration $C_0$ of an entirety of the Al—Mn-based alloy is defined as an Mn precipitate concentration $C_2$,
a ratio $C_1/C_2$ of the Mn solid solution concentration $C_1$ to the Mn precipitate concentration $C_2$ is in a range of 0.1 or more and 2.7 or less.

* * * * *